(12) United States Patent
Westwick et al.

(10) Patent No.: US 7,956,787 B2
(45) Date of Patent: Jun. 7, 2011

(54) SAR ANALOG-TO-DIGITAL CONVERTER HAVING DIFFERING BIT MODES OF OPERATION

(75) Inventors: Alan Westwick, Austin, TX (US); Xiaoling Guo, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/339,751

(22) Filed: Dec. 19, 2008

(65) Prior Publication Data

US 2010/0156684 A1   Jun. 24, 2010

(51) Int. Cl.
*H03M 1/12* (2006.01)
(52) U.S. Cl. ........................ 341/155; 341/163
(58) Field of Classification Search .................. 341/144, 341/155, 172, 163, 122, 131
See application file for complete search history.

(56) References Cited

U.S. PATENT DOCUMENTS

| | | | | | |
|---|---|---|---|---|---|
| 4,145,689 | A | * | 3/1979 | Butler et al. | 341/136 |
| 4,314,235 | A | * | 2/1982 | Ruf et al. | 341/122 |
| 5,055,847 | A | * | 10/1991 | Rybicki et al. | 341/162 |
| 6,236,347 | B1 | * | 5/2001 | Cheng | 341/145 |
| 6,734,817 | B2 | * | 5/2004 | Naka et al. | 341/155 |
| 7,015,853 | B1 | * | 3/2006 | Wolff et al. | 341/155 |
| 7,199,746 | B1 | * | 4/2007 | Chowdhury et al. | 341/172 |
| 7,265,694 | B2 | * | 9/2007 | Guidry | 341/120 |
| 7,265,708 | B2 | * | 9/2007 | Mitra et al. | 341/172 |
| 7,671,769 | B2 | * | 3/2010 | Cesura et al. | 341/155 |

* cited by examiner

*Primary Examiner* — Peguy JeanPierre

(57) ABSTRACT

A method for operating an N-bit SAR ADC as a greater than N-bit resolution SAR ADC includes the steps of taking a plurality of samples for each analog value being converted to a digital value by the SAR ADC. A portion of an LSB is added to all but one of the plurality of samples. The plurality of samples are then accumulated and output as a digital value. The digital value has a resolution greater than the N-bit resolution of the SAR ADC.

15 Claims, 7 Drawing Sheets

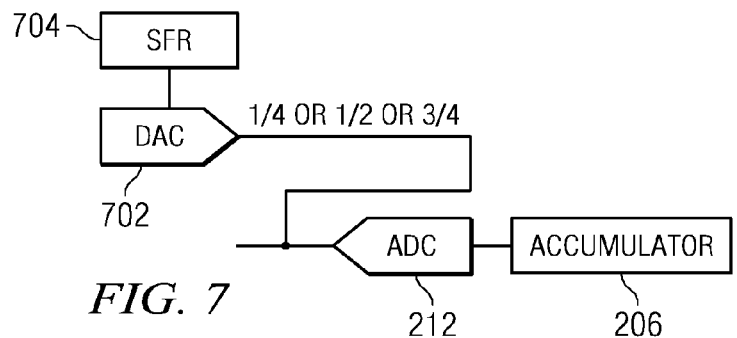
*FIG. 7*
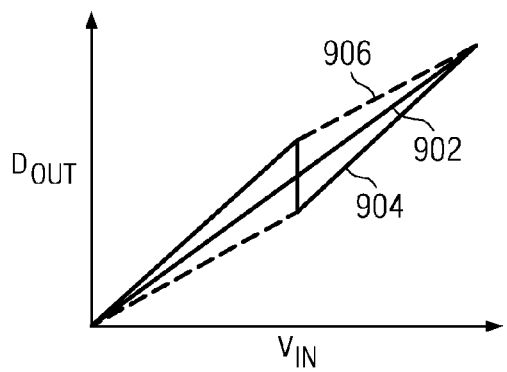
*FIG. 9*
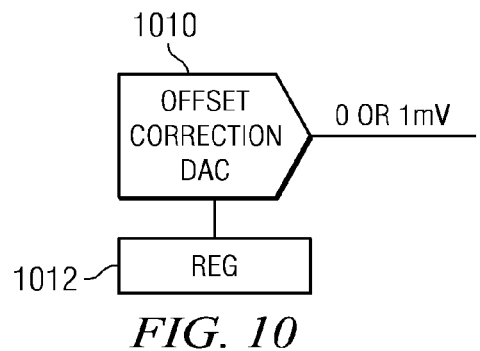
*FIG. 10*
| SAMPLE 1 | SAMPLE 2 | SAMPLE 3 | SAMPLE 4 | OFFSET |
|---|---|---|---|---|
| 0 | 0 | 0 | 0 | 0 |
| 0 | 0 | 0 | 1 | 1/4 |
| 0 | 0 | 1 | 1 | 1/2 |
| 0 | 1 | 1 | 1 | 3/4 |
| 1 | 1 | 1 | 1 | 1 |
*FIG. 11*

US 7,956,787 B2

SAR ANALOG-TO-DIGITAL CONVERTER HAVING DIFFERING BIT MODES OF OPERATION

CROSS-REFERENCE TO RELATED APPLICATIONS

N/A

TECHNICAL FIELD

The present invention relates to SAR analog-to-digital converters, and more particular to an analog-to-digital converter that may operate in differing bit modes of operation.

BACKGROUND

A successive approximation analog-to-digital converter (ADC) has been the mainstay of data acquisition systems for many years. Recent design improvements have extended the sampling frequency of these ADCs into the megahertz region with 18-bit resolution. The basic successive approximation ADC performs conversions on command. In order to process AC signals, SAR ADCs must have an input sample-and-hold device to keep the signal constant during the conversion cycle. On the assertion of a CONVERT START command, the sample-and-hold device is placed in the hold mode, and an internal digital-to-analog converter (DAC) is set to mid-scale. A comparator determines whether the sampled analog value is above or below the DAC output, and the result (bit 1, the most significant bit of the conversion) is stored in the successive approximation register (SAR). The DAC is set either to ¼ scale or ¾ scale (depending on the value of bit 1), and the comparator makes the decision for bit 2 of the conversion. The result is stored in the register, and the process continues until all of the bit values have been determined. When all the bits have been set, tested, and reset or not as appropriate, the contents of the SAR correspond to the value of the analog input, and the conversion is complete. These bit "tests" form the basis of a serial output version SAR ADC. Note that the acronym "SAR" actually stands for Successive Approximation Register (the logic block that controls the conversion process), but is universally accepted as the acronym for the architecture itself.

The DAC portion of the SAR ADC can utilize a capacitor network. The advantage of the switched-capacitor DAC is that the accuracy and linearity is primarily determined by high-accuracy photolithography, which in turn controls the capacitor plate area, and the capacitance as well as matching. In addition, small capacitors can be placed in parallel with the main capacitors, which can be switched in and out with bit switches under control of autocorrelation routines to achieve high accuracy and linearity without the need for thin-film laser trimming.

Each of the capacitors in the switched capacitor DAC has one plate thereof connected to a common node, which is connected to one input of a comparator, and the other plate thereof connected to an associated switch that can connect the plate to ground, the analog input voltage, AIN, or a reference voltage, VREF. In the sample or tracking mode, the analog input voltage, AIN, is constantly charging and discharging the parallel combination of all the capacitors. The hold mode is initiated by opening the switch, thus leaving the sampled analog input voltage on the capacitor array. Typically, the other input of the comparator is connected to ground or a common mode voltage. Some type of auto-zero switch will maintain the inputs at the same voltage until after AIN has been sampled, at which time the common node is allowed to "float", allowing the voltage at the common node to move as the bit switches are manipulated. If respective bit switches are all connected to ground, a voltage equal to −AIN appears at the common node. Connecting the bit switch for the most significant bit (MSB) to VREF adds a voltage equal to VREF/2 to −AIN. The comparator makes the MSB bit decision, i.e., is the common node above the voltage on the reference input to the comparator, and the SAR either leaves MSB bit switch connected to VREF or connects it to ground depending on the comparator output (which is high or low depending on whether the voltage at the common node is negative or positive, respectively).

SAR analog-to-digital converters are typically configured in to operate in an N-bit mode of operation. However, within some circuit designs, it is desired that the SAR analog-to-digital converter have the ability to operate in greater than an N-bit resolution. Thus, there is a need for an SAR analog-to-digital converter having the ability to operate in differing bit modes of operation.

SUMMARY

The present invention as disclosed and described herein, in one aspect thereof, comprises a method for operating an N-bit SAR (Successive Approximation Register) ADC (Analog-to-Digital Converter) as a greater than N-bit resolution SAR ADC. The process includes the steps of taking a plurality of samples for each analog value being converted to a digital value by the SAR ADC. A portion of an LSB is added to all but one of the plurality of these samples. The plurality of samples is accumulated and output as a digital value wherein the digital value has a resolution greater than the N-bit resolution of the SAR ADC.

BRIEF DESCRIPTION OF THE DRAWINGS

For a more complete understanding, reference is now made to the following description taken in conjunction with the accompanying Drawings in which:

FIG. 7 illustrates a digital-to-analog controller of a SAR ADC using dynamic threshold adjustment;

FIG. 9 illustrates a linear response of input voltage with respect to a digital output voltage;

FIG. 10 illustrates an offset correction digital-to-analog converter; and

FIG. 11 illustrates the manner in which offset voltages may be included in only a portion of samples of the ADC to achieve fractional LSB adjustments to the voltage offset.

DETAILED DESCRIPTION

Figure 1:
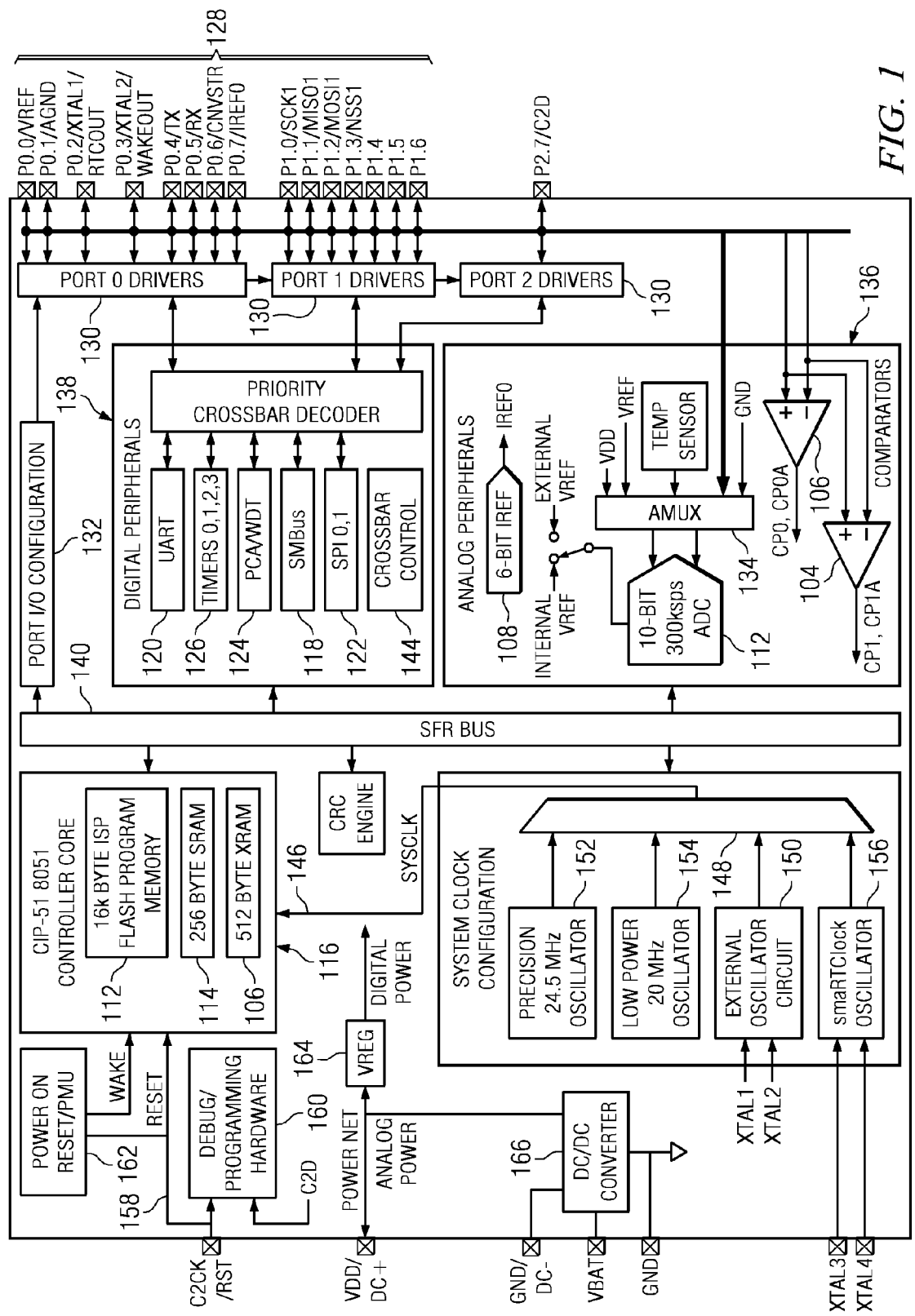
FIG. 1 illustrates an integrated circuit including a successive approximation (SAR) analog-to-digital converter (ADC)

Referring now to the drawings, wherein like reference numbers are used herein to designate like elements throughout, the various views and embodiments of a SAR ADC converter with various bit modes of operation are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated an integrated circuit that is comprised of a fully integrated mixed signal system on a chip with a 10 bit multichannel ADC 102, 2 voltage comparators 104 and 106, a 6 bit current reference 108 and an 8051 compatible microcontroller core 110 with 16 kB of flash memory 112. The microcontroller core 110 also includes 256 bytes of SRAM memory 114 and 512 bytes of XRAM memory 116. There is also provided an I²C/SMBus 118, a UART 120 and a SPI 122 serial interface implemented in hardware (not "bitbanged" in user software) as well as programmable counter array/watch dog timer 124 and various system timers 126. There are also provided 16 general purpose port I/Os 128 that are driven by a number of port drivers 130. The port drivers 130 are configured via a port I/O configuration logic 132.

The analog peripherals include a multiplexer 134, which is operable to interface analog inputs to the analog-to-digital converter 102. The microcontroller core 110 effectively configures and manages the analog peripherals 136 and the digital peripherals 138. The flash memory 112 can be reprogrammed even in circuit providing non-volatile data storage, and also allowing field upgrades of the 8051 firmware. The MCU 100 can also individually shut down any or all of the various peripherals to conserve power. The processing core 110 is interfaced through an internal SFR bus 140 to the various input/output blocks. A priority crossbar decoder 142 under the control of a crossbar control logic 144 provides an interface between the UART 130, timers 126, PCA/watch dog timer 124, SMBus 118 and SPI interface 122 with the digital I/O output pins 128. This is a configurable interface. The priority crossbar decoder 142 can be configured to interface with any of the ports of the I/O side thereof, which provide interface between the crossbar 142 and the core 110. Further, the crossbar decoder 142 can interface through any of the functional blocks 118 through the SFR bus 140. The crossbar control block 144 is configured by the processing core 110. In addition, the processing core 110 is operable to configure the analog peripherals 136.

The processing core 110 is controlled by a clock signal provided via system clock line 146. The clock is selected from one of four sources with a multiplexer 148. The first source is an external oscillator circuit 150. The multiplexer 148 may also select one of an internal 24.5 MHz precision oscillator 152 or a low power 20 MHz internal oscillator 154. The multiplexer 148 may also provide a clock signal from a real time clock oscillator 156. The processing core 110 is also controlled by a reset input on reset line 158.

The debugging/programming hardware 160 allows non-intrusive, full speed in circuit debugging using the MCU processing core 110. This debug hardware 160 supports inspection, modification of memory and registers, setting brake points, single stepping, run and halt commands. All analog and digital peripherals are fully functional while debugging using C2. The C2 interface pins can be shared with user functions allowing in system debugging without occupying package pins. The CRC engine enables CRC checks of data.

The power on reset/PMU module 162 allows the generation of reset and wake up signals to the processing core 110. The voltage regulator 164 provides a regulated voltage to the digital peripheral components 138 responsive to the system power $V_{DD}$ provided via the power net or from the DC/DC boost converter 166.

Figure 2:
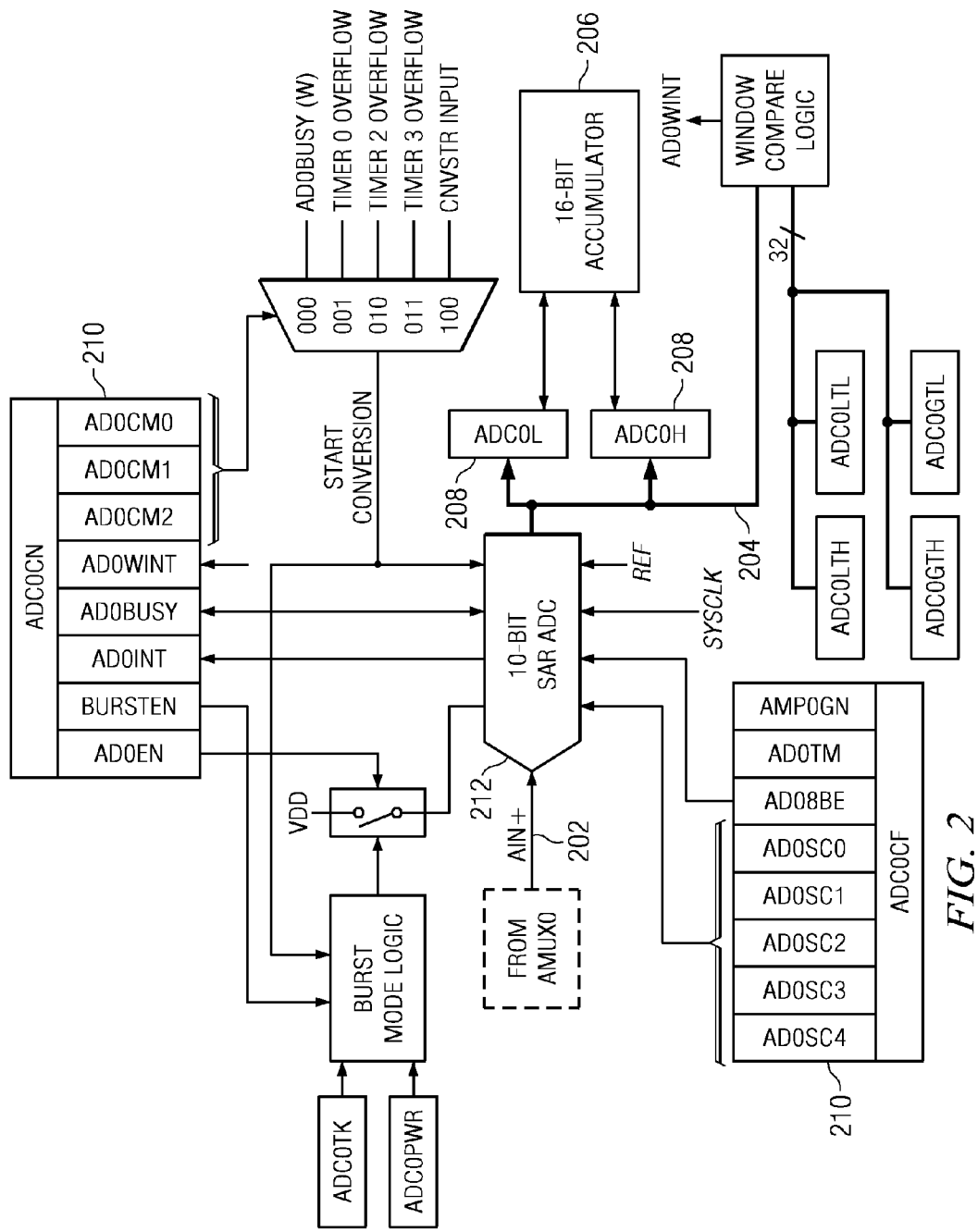
FIG. 2 illustrates a block diagram of an N-bit SAR analog-to-digital converter.

The DC/DC boost converter 166 allows operation from a single cell battery with a supply voltage as low as 0.9 volts. The DC/DC boost converter 166 is a switching boost converter with an input voltage range of 0.9 to 1.8 volts and has a programmable output voltage range of 1.8 to 3.3 volts. The default output voltage is 1.9 volts. The input voltage must be at least 0.2 volts lower than the output voltage. The DC/DC boost converter 166 can supply the chip with up to 65 mW of regulated power and can be used for powering other devices in the system. This allows the most flexibility when interfacing to sensors and other analog signals which typically require higher supply voltages than a single cell battery can provide Referring now to FIG. 2, there is illustrated a block diagram of the N-bit SAR analog-to-digital converter 102. The SAR analog-to-digital converter 102 receives analog signals over a line 202 from the analog MUX 134 (FIG. 1). The output of the SAR ADC 212 is provided via bus 204 to a 16-bit accumulator 206 through associated registers 208. The successive approximation register (SAR) ADC 102, in a preferred embodiment, is a 10-bit device with integrated track and hold and a programmable window detector. The 16-bit accumulator 206 can automatically average the ADC results in order to enable effective 11, 12 or 13-bit ADC results without additional CPU intervention. The analog-to-digital converter 102 can sample the voltage on any of the GPIO pins through input line 202 from the analog MUX 134. The analog-to-digital converter 102 is preferably configurable under software control via a number of special function registers 210. The registers ADCOH 208a and ADCOL 208b contain the high and low bytes of the output conversion code from the ADC at the completion of each conversion. The accumulator 206 accumulates consecutive samples of sets of 4, 8, 16, 32, or 64 samples. The control bits of the ADOSJST SFR Register can be used to format the contents of the 16-bit accumulator 206. The accumulator 206 results can be shifted right by one, two, or three bit positions. Using over-sampling and averaging, the effective resolution of the analog-to-digital converter 102 can be increased by one bit each time the over-sampling rate is increased by a factor of four.

Figure 3:
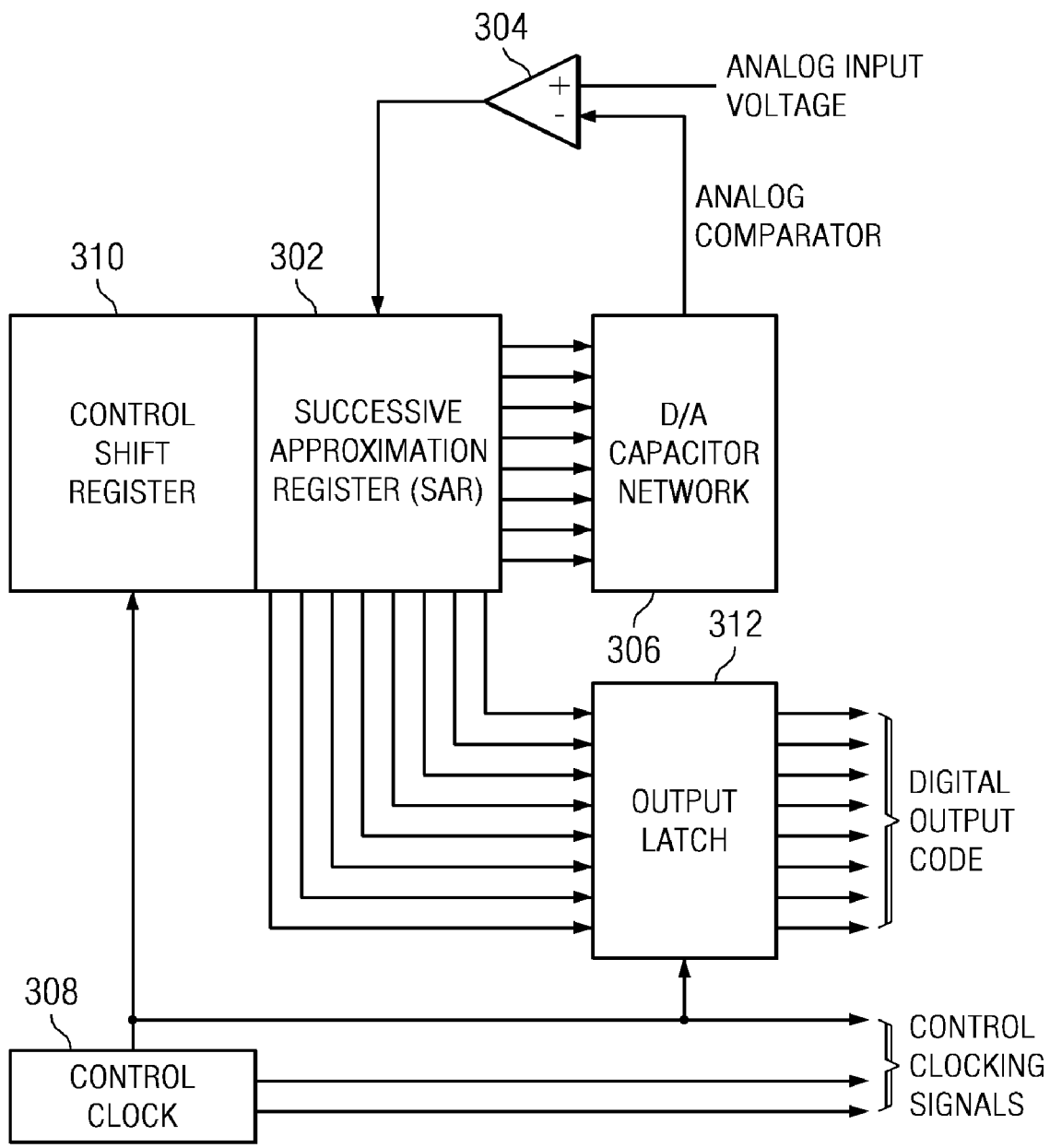
FIG. 3 is a functional block diagram of one embodiment of a SAR ADC using a capacitor network.

Referring now to FIG. 3, there is illustrated a functional block diagram of one embodiment of a SAR ADC utilizing a capacitor network 306. The SAR ADC can approximate the analog-to-digital signal to form an N-bit digital code. A successive approximation utilizes a successive approximation algorithm (SAR algorithm) to individually compare an analog input voltage to the mid-point of one of n ranges to determine the value of one bit. This process is repeated a total of n times, using n ranges, to determine the n bits of the code. The comparison is accomplished as follows. The SAR algorithm determines if the analog input is above or below the mid-point and sets the bit of the digital code accordingly. The SAR algorithm then assigns the bits beginning with the most significant bit. The bit is set to "1" if the analog input is greater than the mid-point voltage, or it is set at "0" if it is less than the mid-point voltage. The SAR algorithm then moves to the next bit and sets it as a "1" or a "0" based on the results of comparing the analog input with a mid-point of the next allowed range. Because the SAR algorithm must perform one approximation for each bit in the digital code, an n bit code requires n approximations.

The SAR ADC as illustrated in FIG. 3 consists of four functional blocks, a successive approximation register (SAR) 302, an analog comparator 304, a D/A converter 306 based on a switching capacitor network, and a clock 308. Control of the SAR algorithm to the n bit approximation is controlled by a control shift register 310. The output latch 312 latches in the bits of the digital output code as they are determined by the SAR 302 during the conversion cycle. The analog comparator 304 performs the comparisons of an analog input voltage with the mid-point of the selected one of n ranges presently being examined.

Figure 4:
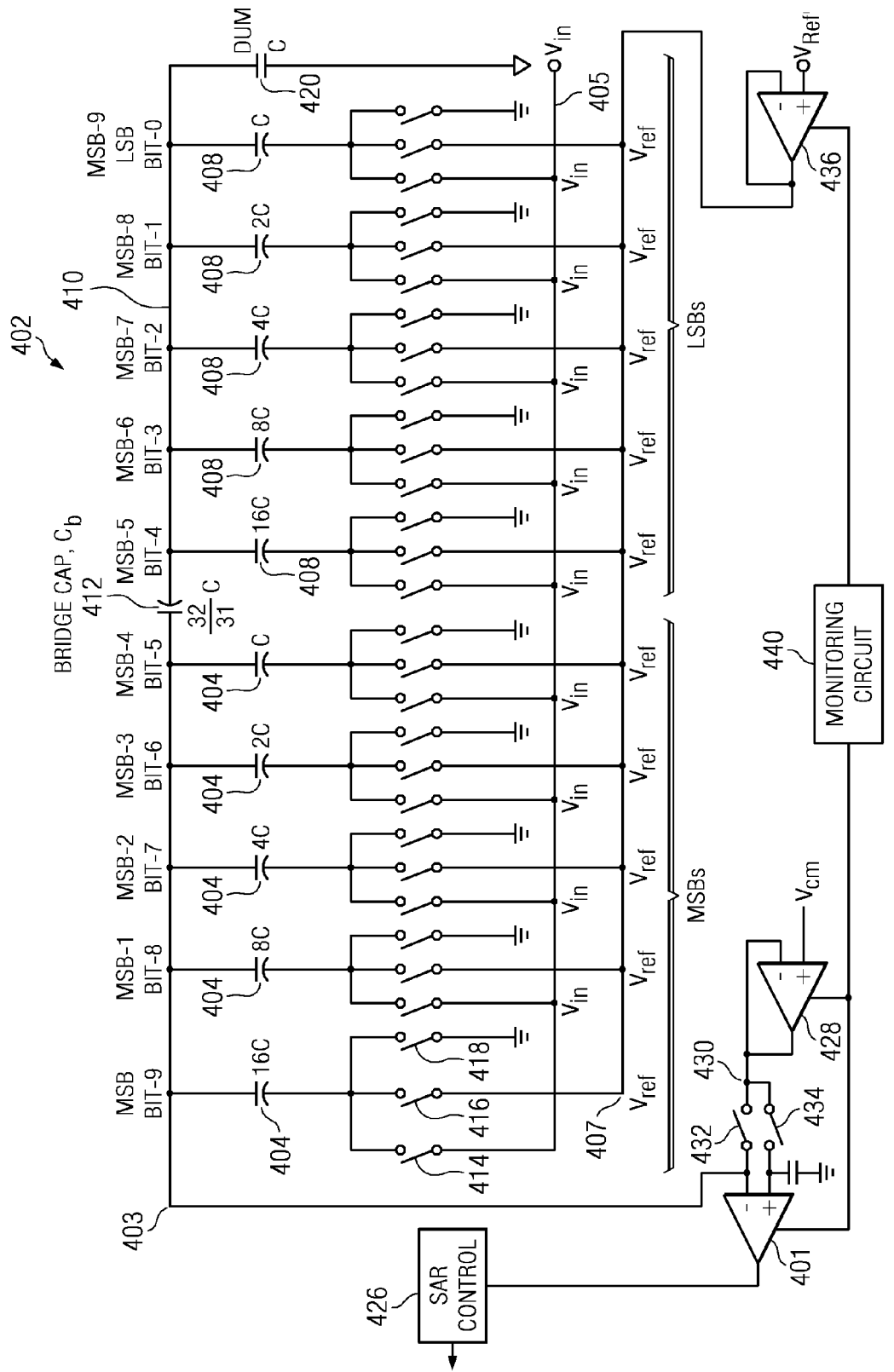
FIG. 4 is a schematic diagram of a 10-bit split array binary weighted analog-to-digital converter.

Referring now to FIG. 4, there is schematic diagram of a 10-bit split array binary weighted analog to digital converter utilizing a switched capacitor DAC configuration. The ADC is comprised of a comparator 401 having a positive and a negative input. The negative input is connected to a node 403, which node is connected a capacitor array 402. The capacitor array 402, in accordance with a conventional successive approximation algorithm, is a charge redistribution, binary weighed switch capacitor array that will have one plate of the capacitors associated therewith connected to an input voltage on an input node 405 or a reference voltage on a node 407 or ground, as will be described in more detail hereinbelow.

The 10-bit split capacitor array 402 includes a primary array and a secondary array. The primary array consists of a group of binary weighted switched capacitors 404 connected in parallel, wherein a first plate of each capacitor is interconnected at a common node 403, which is provided as an input to the negative input of the comparator 401. The secondary array consists of a second group of binary weighted capacitors 408 connected in parallel, wherein a first plate of each of these capacitors is connected to a second common node 410. The first node 403 and the second node 410 are interconnected via a bridge capacitor 412, this referred to as a bridged capacitor array. The capacitors 404 and 408 are binary weighted capacitors such that the capacitors progressively double in their capacitance from bit 0 to bit 4 and from bit 5 to bit 9. Thus, the capacitance of bit 0 is C, the capacitance of bit 1 is 2C, the capacitive of bit 2 is 4C and so forth until the capacitance of the bit 4 is equal to 16C. There is a similar progression in the capacitance from bit 5 to bit 9. The opposite plates of each of the capacitors 404 or 408, which are not connected with common nodes 403 and 410, respectively, are selectively connected to either of an input voltage $V_{IN}$ at node 405 through a respective bit switch 414, a reference voltage $V_{REF}$ at node 407 through a respective bit switch 416 or ground through a respective bit switch 418. The capacitors connected to common node 403 comprise the most significant bits (MSBs) of the bridged capacitor DAC 402, and the capacitors connected to the node 410 comprise the least significant bits (LSBs). A dummy capacitor 420 connects between node 410 and ground.

The output of the comparator 401 is connected to a successive approximation register (SAR) control block 426, which is operable to execute the successive approximation algorithm. As is well-known in the art, the successive approximation register is operable to first sample the input voltage across all of the capacitors in the capacitor array 402, which, in the present embodiment as will be described hereinbelow, actually only provides sampling for the input voltage over all or only a portion of the capacitors. However, conventional SAR algorithms will sample with input voltage across all the capacitors. After this, select ones of the capacitors have the bottom-plate thereof connected to ground and select ones of the capacitors have the bottom-plate thereof connected to the reference voltage node 407 in a predetermined order. This causes redistribution of the charge, which charges the voltage on node 403. This is compared with a reference voltage and, if the voltage on node 403 is above the reference, then this capacitor has the bottom-plate thereof returned to ground. However, if the voltage on the node 403 does not rise above the reference voltage, then the voltage from the bottom-plate of this capacitor remains on the reference node voltage on node 407. This is a successive operation that sequentially steps through each of the capacitors, from the most significant or largest capacitor, to the least the significant or smallest capacitor. Again, this SAR operation is conventional.

In order to set a reference voltage on 407, a common mode voltage driver 428 is provided that is operable to drive a node 430, a lower impendence, with a common mode voltage $V_{CM}$ output thereof, the output connected to node 430. This is a non-inverting driver. Node 430 is connected via an auto-zero switch 432 to node 403 and via an auto-zero switch 434 to the positive input of the comparator 401. When the input voltage on node 405 is sampled onto the capacitor array 402, switches 432 and 434 are configured such that the common mode voltage $V_{CM}$ is connected to nodes 403 and to the positive input of comparator 401.

The reference voltage on node 407 is provided by reference voltage driver 436 and is operable to receive an input voltage $V_{REF}'$ on a positive input, voltage driver 436 having a negative input connected to the output thereof, the output connected to node 407 to provide a reference voltage $V_{REF}$.

A monitoring circuit 440 monitors the clock frequency within the SAR ADC 102 and provides control bits to SFR registers associated with each of the reference buffer 436, the common mode buffer 428 and the comparator 401. While the present disclosure has illustrated a single comparator 401, the comparator 401 may be implemented as a cascade of several comparator stages. The monitoring circuit 440 is utilized to monitor an operating frequency of the SAR ADC clock signal and alter the bias currents applied to each of the comparator 401, common mode buffer 428 and reference voltage buffer 436 based upon the clock frequency. Any number of monitoring circuits 440 may be utilized for providing this control of the bias voltages to these components.

Depending upon the operating frequency of the SAR ADC 102, the bias currents applied to the each of the reference buffer 436, common mode buffer 428 and comparator 401, may be altered in order to save power. Changes in frequency of the clock may arise when a low power mode of operation is initiated or based on other system factors. Thus, in a lower frequency mode of operation wherein smaller bias currents may be utilized with each of the voltage reference buffer, common mode buffer and comparator, the bias currents may be reduced by a pre-selected amount in order to save power. When the system frequency rises to a higher level, the bias currents to the circuits may be increased back to the higher bias current levels necessary for operation at the higher frequencies. Thus, the bias currents of each of the reference voltage buffer, common mode buffer, and comparator may be dynamically altered based upon operating clock frequencies of the SAR ADC. This can provide significant power saving benefits to the operation of the circuitry including the SAR ADC. In alternative embodiments, when operating frequencies are to be at fixed, known levels, the bias current of the reference voltage buffer, common mode voltage buffer and comparator may be programmably selected by the user to provide the higher or lowest bias current values based upon the desired operating characteristics.

Figure 4A:
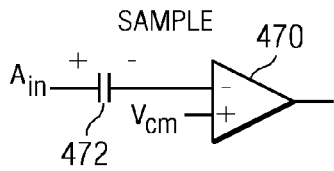
FIGS. 4a-4c illustrate the various operations of the digital converter of FIG. 4.
Figure 4B:
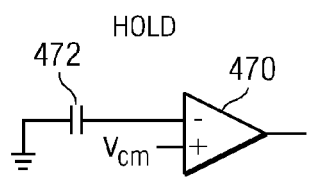
Figure 4C:
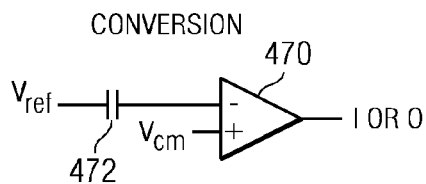

Referring now to FIGS. 4a through 4c, there is more fully illustrated the various states of the SAR converter when determining a particular bit using a comparator 470. Initially, as illustrated in FIG. 4a, the comparator 470 has capacitor 472 for a binary weighted capacitor array connected on the upper plate thereof to negative input of comparator 470 (capacitor 472 is the MSB capacitor for the array, the remaining capacitors not illustrated for exemplary purposes). The analog input voltage $A_{IN}$ is sampled on the lower or "switched" plate of capacitor 472 in the "sample" or "tracking" mode of operation. The negative input of comparator 470 is initially auto-zeroed to the voltage on the positive input of comparator 470 prior to or during the tracking mode of operation, such that both voltages are equal. The voltage on the positive input of comparator 470, in many cases, is set at a common mode voltage, $V_{CM}$, or ground.

In the "hold" mode of operation (FIG. 4b), the switched plate of capacitor 472 is connected to ground, thus pulling the negative input of comparator 470 to a voltage of $V_{CM}-A_{IN}$, as the positive input of comparator 470 remains connected to $V_{CM}$, and the logic state of the comparator 470 goes high (logic "1"). Referring now finally to FIG. 4c, when the digital value for the bit associated with capacitor 472 is being determined during the "conversion" mode of operation, the switched plate of capacitor 472 is switched to the reference voltage $V_{REF}$ thus disposing the negative input of comparator 470 at a voltage of $V_{CM}-A_{IN}+V_{REF}/2$. The output of the comparator 470 will become one or zero depending on whether the analog input voltage $A_{IN}$ is larger than one-half the reference voltage $V_{REF}$ (noting the remaining capacitors in the array (not shown) equal the value of the capacitor 472). If $A_{IN}$ is larger than one-half $V_{REF}$, the output state of comparator 470 remains at a logic high (logic "1"), indicating that $V_{CM}-A_{IN}+V_{REF}/2$ is less than $V_{CM}$. If not, the output of the comparator 470 goes to a logic low level (logic "0"), indicating that $V_{CM}-A_{IN}+V_{REF}/2$ is greater than $V_{CM}$. The associated MSB bit is set to the logic level indicated by the output of the comparator 470.

Figure 5:
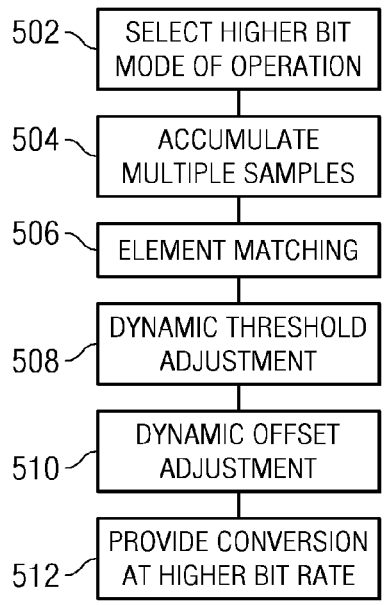
FIG. 5 is a flow diagram describing the manner for converting a 10 bit SAR ADC into a higher bit mode of operation.

Referring now to FIG. 5, there is illustrated a flow-diagram describing the manner in which the 10-bit SAR ADC 102 may be configured to operate in a higher bit mode of operation. In the preferred embodiment, the 10-bit SAR ADC 102 will be configured to operate as a 12-bit SAR ADC. This is achieved by changing the operations of the 10-bit SAR ADC 102 and no new circuitries are required. Initially, the higher bit mode of operation is selected at step 502, and the appropriate values are set within the SFR registers associated with the 10-bit SAR ADC 102. At step 504, the 16-bit accumulator 206 is configured to accumulate multiple samples of a converted analog value by the 10-bit SAR ADC 102. In the 12-bit mode of operation, the 16-bit accumulator 206 will accumulate four samples from the ADC 102. When taking each of these samples at step 504, the system utilizes element matching at step 506 for the capacitors in an associated capacitor array as will be more fully described herein below. Element matching involves using different configurations of the capacitors within the capacitor array of the ADC 102 for each of the samples. This allows for non-linearities within the capacitors of the capacitor array to be cancelled out since the non-linearities would be rearranged over each of the four samples of the ADC 102. Additionally, the system will perform dynamic threshold adjustments at step 508 while taking each of the multiple samples at step 504. Within the dynamic threshold adjustment process, offset values are added to successive samples. Thus, within the 12-bit example, for the first sample, no offset is added. For a second sample a quarter LSB offset is added. For the third sample, a half LSB offset is added, and for a fourth sample, a three-quarter LSB offset is added. Use of this offset within the successive samples increases of the resolution of the ADC 102 from 10-bits to 12-bits.

Finally, the ADC 212 may utilize dynamic offset adjustment at step 510, wherein the voltage offset provided by an offset digital-to-analog controller of the ADC 212 provides quarter LSB offset resolution rather than 1 LSB resolution by altering the number of times the 1 LSB offset is provided to a particular sample. If quarter LSB offset resolution is desired, the 1 LSB offset is provided to only one of the samples. When these samples are accumulated, this will provide an average value of one-quarter LSB offset. Similarly, when half-LSB resolution is required, two of the four samples are provided with the 1 LSB voltage offset before accumulation. When three-quarter LSB resolution is desired, three of the four samples are provided with a 1 LSB offset voltage. Once these combine processes have been performed, the provided 12-bit resolution conversion is provided at step 512 using the 10-bit ADC 102 in 12-bit mode. The various details of steps 504-510 are more fully described with respect to FIGS. 6 through 11 hereinbelow.

Figure 6:
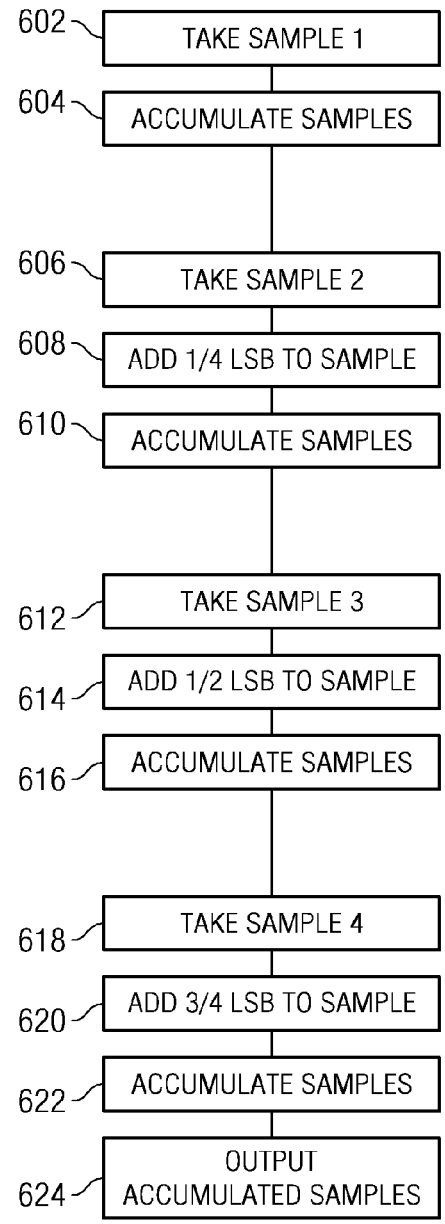
FIG. 6 is a flow diagram illustrating the manner for accumulating multiple samples using dynamic threshold adjustment.

Referring now to FIG. 6, there is illustrated the manner in which multiple accumulated samples with dynamic threshold adjustments may be used to improve the resolution of the 10-bit SAR ADC 212 to 12-bit resolution according to one embodiment of the present disclosure. The dynamic threshold adjustment feature improves the resolution of the SAR ADC 102 by generating a pattern of four subdivisions of one LSB (with values of 0, +0.25, +0.5 and +0.75 LSBs) and adding these subdivisions to the input signal. The process comprises an extension of the successive approximation routine. For the first 10 bits of the conversion successively smaller capacitors are switched and the comparator is used to measure whether the results are above or below the middle of the input voltage range of the converter. Two more bits are added to the conversion by using a slightly different method of averaging the results of four conversions using the four sub LSB steps.

Initially, at step 602, a first sample is taken of the signal being converted by the ADC 112. This sample is accumulated at step 604 within the 16-bit accumulator 206. A next sample is taken at step 606. This sample has a quarter LSB offset added to the sample at step 608. This sample with the added quarter-LSB offset is accumulated with the original sample at step 610. A third sample is taken at step 612. This sample has a half-LSB offset added to it at step 614 and this sample is accumulated with the first and second samples at step 616. Finally, a fourth sample is taken by the ADC 212 at step 618. This sample has a three-quarter LSB offset added to the sample at step 620. The sample with three-quarter LSB offset is accumulated within the accumulator 206 at step 622. The accumulated output is output at step 624.

The quarter, half, or three-quarter LSB offset is provided from a digital-to-analog controller (DAC) 702 associated with the ADC 212 as illustrated in FIG. 7. The output of the DAC 702 is provided to the input of the ADC 212, which effectively shifts the threshold of ADC 212 by the amount of the offset. The quarter, half or three-quarter LSB offset provided by the DAC 702 is controlled responsive to program values within an SFR register 704. The SFR registers 704 are programmed by control bits from the processing core 110. The quarter, half or three-quarter outputs of the DAC 702 are associated with the respective samples output from the ADC 212 as described hereinabove.

In addition to taking multiple samples having a varying charge offset applied to each sample, the system will utilize dynamic element matching using different arrangements of capacitors for each of the four sampling conversions in order to average out any capacitor mismatch in the capacitor array. This process is more fully described with respect to FIG. 8. This process improves the integral linearity of the output of the ADC 102 to a 12-bit level, rather than improving the resolution of the ADC as does the use of dynamic threshold adjustments.

Figure 8:
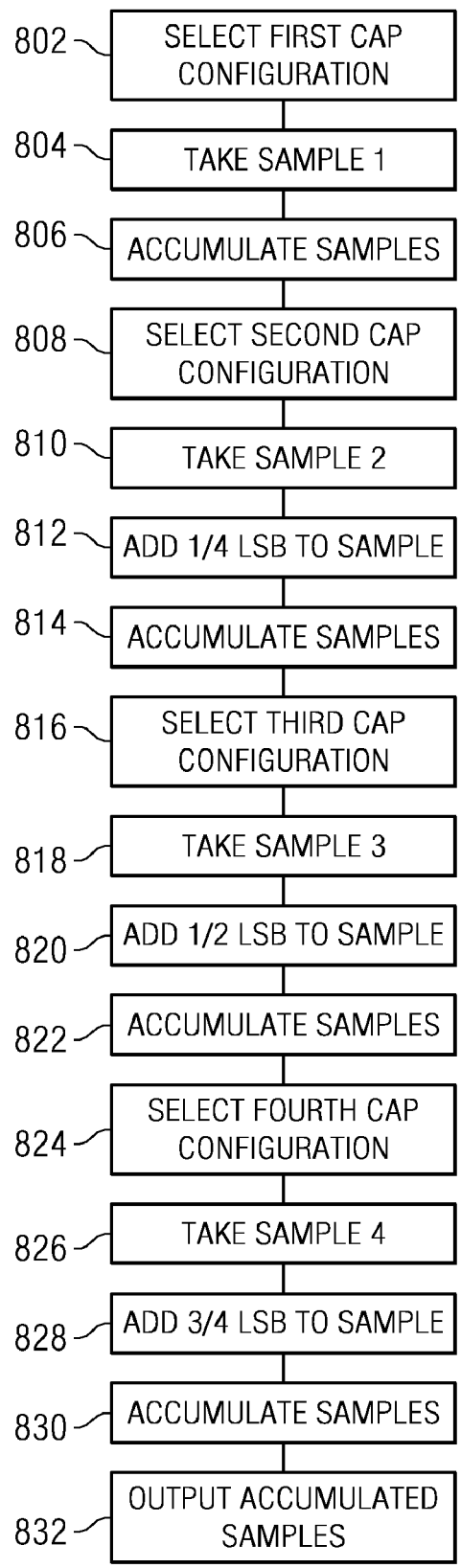
FIG. 8 is a flow diagram describing the manner for using dynamic element matching to improve the linearity of a SAR ADC.

Referring now to FIG. 8, initially a first configuration of the capacitors from the capacitor array is selected at step 802 for the first sample. Once the initial configuration has been selected, the ADC 102 takes a first sample at step 804. The samples are accumulated at step 806. A second capacitor configuration from the capacitor array is selected at step 808. The second capacitor configuration from the capacitor array is used for taking a second sample at step 810 and the dynamic threshold adjustment is used by adding a quarter LSB offset to the sample. The second sample is accumulated with the first sample at step 814. A third capacitor configuration from the capacitor array is selected at step 816 and is used for taking a third sample at step 818. The half LSB offset is added to the third sample at step 820 and the third sample is then accumulated with to the other two samples at step 822. Finally, a fourth capacitor configuration from the capacitor array is selected at step 824 and is used to take a fourth sample at step 826. The three-quarter LSB offset is added to the sample at step 828 and this sample is accumulated with the other samples at step 830. The output accumulated samples are provided from the accumulator at step 832.

The dynamic element matching enables a more linear response at the output of the ADC 102 in the 12-bit mode of operation. FIG. 9 illustrates a linear response of VIN with respect to the digital output of the ADC 102 by line 902. While line 902 represents an idealized output of the ADC 102, line 904 represents a non-linear response provided in a 12-bit mode of operation without dynamic element matching. As noted above, the operation of the SAR ADC 102 depends on maintaining proper binary-weighted values for the capacitors in the array. However, design or manufacturing variations will cause errors in the capacitor values. Using larger capacitors will reduce the matching errors at the expense of larger area and higher power consumption. Therefore, capacitor sizes are chosen to be as small as possible to implement a particular converter. Higher-resolution converters typically require larger capacitors to achieve the expected linearity.

While all capacitors in the array must be implemented in the proper ratios for the response to follow the ideal line 902, matching errors involving the MSB capacitor cause the largest deviation from the ideal line. The response represented by line 904 is the result of a mismatch between the MSB capacitors and the remainder of the capacitor array; in this case, the MSB capacitor is smaller than the sum of the other capacitors. Although the size of the error is magnified for clarity, it is representative of the linearity problem that would be expected when implementing a 12-bit converter using a capacitor array that is optimized for 10-bit operation.

With dynamic element matching, a first conversion is performed using the nonlinear characteristic represented by line 904. By means of additional switches on the capacitors, the particular capacitor units that are used for the MSB capacitor are then swapped with the capacitor units used for the remainder of the bits, and a second conversion is performed. The second conversion will have opposite linearity errors, as represented by line 906 in FIG. 9. As can be observed from FIG. 9, when the results of the first and second conversions are accumulated, the resulting linearity will follow the ideal line 902. Therefore, applying dynamic element matching to two samples can cancel the mismatch error of the MSB capacitor. In a similar fashion, applying dynamic element matching to four samples can cancel mismatch errors associated with the two largest capacitors (i.e. the MSB and MSB-1 capacitors). If the matching errors of the two largest capacitors are eliminated, then a 10-bit SAR capacitor array will be capable of achieving the linearity of a 12-bit SAR ADC.

Referring now to FIG. 10, there is illustrated the offset correction DAC 1010. The offset correction DAC 1010 is used for correcting voltage offsets within the SAR ADC. The operation of the offset correction DAC 1010 is controlled by an SFR register 1012. The resolution of the offset correction DAC 1010 enables it to provide an output of approximately 1 mV or 1 LSB responsive to a 1.024 reference voltage input. In order to provide a smaller offset voltage correction from the DAC 1010, a smaller offset than 1 mV resolution would be required. This may be accomplished by, rather than by providing a 1 mV of offset for each sample of the ADC 102, the 1 mV may only be used on certain samples.

The use of dynamic offset adjustment within the SAR ADC is a means to correct the undesired offset voltages of the converter. Ideally, the offset should be zero, but imperfections in the layout and in the matching of transistors, resistors and capacitors will introduce an offset voltage into the circuit design. This offset is canceled by adding an equal but opposite voltage to the input of the converter. Generally, it is desired that the offset voltage be less than one LSB. The SAR ADC in the 10-bit mode of operation has an offset correction DAC 1010 to supply a correcting voltage that can get the offset to be within one LSB for a 10-bit converter but the resolution is not sufficient for a 12 bit converter. In order to provide the resolution necessary for 12-bit conversions, the use of a dynamic offset adjustment technique is utilized. Since four conversion samples are available to work with, an offset voltage may be applied to the samples for part of the time and not at other times so that the net remaining offset comprises an interpolation between the two. For instance, if an offset correction equivalent to 1.25 10-bit LSBs (which is equivalent to 5 12-bit LSBs) were required a 1 LSB offset would be added for three of the samples and a 2 LSB offset would be added to the fourth sample. This would provide an average offset correction of 1.25 ([1+1+1+2]/4=1.25).

As more fully illustrated in FIG. 11, if no mV offset is provided within any of the four samples by the offset correction DAC 1010, a total offset of 0 is provided. If a 1 mV offset is provided on one of the four samples a quarter mV offset is achieved when the samples are accumulated within the accumulator 206. Likewise, when a 1 mV offset is provided for two of the four samples, a half mV offset is achieved. Similarly, if a 1 mV offset is provided on three of the four samples, a three-quarter mV offset can be achieved. While the offset is shown as being provided in particular ones of the four samples, it should be realized that the 1 mV offset may be provided in any of four samples to achieve the results described herein. Finally, if a 1 mV is provided on each of the four outputs, the 1 mV sample is provided as offset for ADC 102. Similar techniques could be used to achieve an offset between 1 LSB and 2 LSB by adding one or two LSB offsets to the samples.

Using each of the above-described improvements to a 10-bit SAR analog-to-digital converter, the operating characteristics of the 10-bit analog-to-digital converter may be the same as those of a 12-bit SAR analog-to-digital converter without the increased size requirements of a 12-bit converter. Thus, a 10-bit converter including alternative bit modes of operation is thus provided. While the above-description has been made with respect to operating a 10-bit SAR converter in a 12-bit mode of operation, the above-principals would be applicable to increasing the operation of a 10-bit or other N-bit converter to a larger bit mode of operation using the described principles. This is achieved by accumulating sequential N-bit conversion results using dynamic element matching, dynamic threshold adjustments and dynamic offset adjustments.

It will be appreciated by those skilled in the art having the benefit of this disclosure that this SAR analog-to-digital converter having multi-bit modes of operation provides a higher bit SAR ADC without a corresponding increase in size normally required to achieve higher bit results. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A successive approximation register (SAR) analog-to-digital converter (ADC), comprising:
   a capacitor array including a plurality of switched capacitors therein with varying weights each having a common plate connected to a common node and a switched plate;
   at least one comparator for comparing the voltage on the common node of the capacitor array with a reference voltage;
   a SAR controller for sampling an input voltage on said capacitor array in a sampling phase, and redistributing the charge stored thereon in a conversion phase by selectively changing the voltage on select ones of the capacitor array in accordance with a SAR conversion algorithm;
   an accumulator for accumulating a plurality of digital samples of the input voltage;
   at least one control register for configuring operation of the SAR ADC in at least one of a first mode and a second mode of operation, wherein the first mode of operation configures the SAR ADC to operate as an N-bit SAR ADC and the second mode of operation configures the SAR ADC to operate as a greater than N-bit SAR ADC; and
   wherein the SAR ADC uses dynamic offset adjustment to remove voltage offsets in increments between available LSB resolutions in the second mode of operation.

2. The SAR ADC of claim 1, wherein the at least one control register enables four samples to be accumulated within the accumulator for each analog value being converted for the SAR ADC.

3. The SAR ADC of claim 2, wherein the at least one control register enables 0 LSB, ¼ LSB, ½ LSB or ¾ LSB values to be added to each of the four samples before accumulation in the accumulator of the SAR ADC.

4. The SAR ADC of claim 2, wherein a group of the capacitors selected from the capacitor array for each of the four samples are different for each of the four samples.

5. The SAR ADC of claim 2, wherein the at least one control register enables the SAR ADC to be configured to generate a voltage offset in fractional increments of available LSB resolution by adding differing LSB offsets to each of the four samples.

6. The SAR ADC of claim 1, wherein the SAR ADC uses dynamic capacitor matching within the capacitor array to substantially cancel non-linearities in the capacitors in the second mode of operation.

7. The SAR ADC of claim 1, wherein the SAR ADC uses dynamic threshold adjustment to increase a resolution of the SAR ADC to greater than N-bits in the second mode of operation.

8. A method for operating an N-bit SAR ADC as a greater than N-bit resolution SAR ADC, comprising the steps of:
   configuring the N-bit SAR ADC to operate in one of a first mode of operation as the N-bit SAR ADC or a second mode of operation as greater than N-bit SAR ADC;
   taking a plurality of digital samples for each analog value being converted to a digital value by the SAR ADC when in the second mode of operation;
   adding a voltage offset to only a portion of the plurality of samples to enable a voltage offset that is a fractional portion of an LSB of the voltage offset of the N-bit SAR ADC;
   accumulating each of the plurality of samples; and
   outputting the digital value when in the second mode of operation, wherein the digital value has a resolution greater than the N-bit resolution of the SAR ADC in the first mode of operation.

9. The method of claim 8, further including the step of selecting a different grouping of capacitors from a capacitor array for each of the plurality of samples.

10. The method of claim 8, further including the step of providing a dynamic voltage offset adjustment to the plurality of samples for each analog value.

11. The method of claim 8, wherein the plurality of samples comprises four samples.

12. The method of claim 11, wherein the step of adding further comprises the step of adding 0 LSB, ¼ LSB, ½ LSB or ¾ LSB values to successive samples of the four samples.

13. A method for operating an N-bit SAR ADC as a greater than N-bit resolution SAR ADC, comprising the steps of:
   taking a plurality of samples for each analog value being converted to a digital value by the SAR ADC;
   selecting a different grouping of capacitors from a capacitor array for sampling each of the plurality of samples;
   adding a portion of an LSB to at least one of the plurality of samples;
   adding a voltage offset to only a portion of the plurality of samples to enable a voltage offset that is a fractional portion of an LSB of the voltage offset of the N-bit SAR ADC;
   accumulating each of the plurality of samples; and
   outputting the digital value, wherein the digital value has a resolution greater than the N-bit resolution of the SAR ADC.

14. The method of claim 13, wherein the plurality of samples comprises four samples.

15. The method of claim 14, wherein the step of adding further comprises the step of adding 0 LSB, ¼ LSB, ½ LSB or ¾ LSB values to successive samples of the four samples.

* * * * *